(12) United States Patent
Hsu et al.

(10) Patent No.: US 10,347,526 B1
(45) Date of Patent: Jul. 9, 2019

(54) SEMICONDUCTOR STRUCTURE AND METHOD FOR FORMING THE SAME

(71) Applicant: UNITED MICROELECTRONICS CORP., Hsinchu (TW)

(72) Inventors: Chih-Kai Hsu, Tainan (TW); Ssu-I Fu, Kaohsiung (TW); Chun-Ya Chiu, Tainan (TW); Chi-Ting Wu, Tainan (TW); Chin-Hung Chen, Tainan (TW); Yu-Hsiang Lin, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/951,683

(22) Filed: Apr. 12, 2018

(30) Foreign Application Priority Data

Mar. 13, 2018 (CN) .......................... 2018 1 0203798

(51) Int. Cl.
*H01L 21/768* (2006.01)
*H01L 23/485* (2006.01)
*H01L 23/532* (2006.01)

(52) U.S. Cl.
CPC .... *H01L 21/76802* (2013.01); *H01L 21/7684* (2013.01); *H01L 21/76843* (2013.01); *H01L 21/76877* (2013.01); *H01L 23/485* (2013.01); *H01L 23/5329* (2013.01); *H01L 23/53209* (2013.01); *H01L 23/53276* (2013.01)

(58) Field of Classification Search
CPC ......... H01L 27/10826; H01L 21/76802; H01L 21/7684; H01L 21/76843; H01L 21/76877; H01L 23/485; H01L 23/53209; H01L 23/53276
See application file for complete search history.

(56) References Cited

U.S. PATENT DOCUMENTS

| | | | |
|---|---|---|---|
| 7,514,354 | B2 | 4/2009 | Park et al. |
| 7,960,838 | B2 | 6/2011 | Hsu et al. |
| 8,765,600 | B2 | 7/2014 | Chang et al. |
| 2007/0257323 | A1 | 11/2007 | Tsui et al. |
| 2012/0181692 | A1 | 7/2012 | Heinrich et al. |
| 2017/0005098 | A1* | 1/2017 | Aquilino ........... H01L 27/10826 |

* cited by examiner

*Primary Examiner* — Ellias Ullah
(74) *Attorney, Agent, or Firm* — WPAT, PC

(57) ABSTRACT

A semiconductor structure and a method for forming the same are provided. The semiconductor structure includes a substrate, a gate structure, and a conductive element. The gate structure is on the substrate. The gate structure includes a gate electrode and a cap layer on the gate electrode. The conductive element is adjoined with an outer surface of the gate structure. The conductive element includes a lower conductive portion and an upper conductive portion electrically connected on the lower conductive portion and adjoined with the cap layer. The lower conductive portion and the upper conductive portion have an interface therebetween. The interface is below an upper surface of the cap layer.

19 Claims, 17 Drawing Sheets

SEMICONDUCTOR STRUCTURE AND METHOD FOR FORMING THE SAME

This application claims the benefit of People's Republic of China application Serial No. 201810203798.8 filed Mar. 13, 2018, the subject matter of which is incorporated herein by reference.

BACKGROUND

Technical Field

The disclosure relates to a semiconductor structure and a method for forming the same.

Description of the Related Art

With a trend of shrinking a line width of a semiconductor process, a size of a semiconductor structure, comprising for example a transistor or a memory array, etc., has been scaled down. However, an accurate process is necessary for obtaining a fine critical size of a semiconductor process. Otherwise, a semiconductor device would have a low efficiency resulted from a process shift or a side effect in a manufacturing step.

SUMMARY

The present disclosure relates to a semiconductor structure and a method for forming the same.

According to an embodiment, a semiconductor structure is disclosed. The semiconductor structure comprises a substrate, a gate structure, and a conductive element. The gate structure is on the substrate. The gate structure comprises a gate electrode and a cap layer. The cap layer is on the gate electrode. The conductive element is adjoined with an outer surface of the gate structure. The conductive element comprises a lower conductive portion and an upper conductive portion. The upper conductive portion is electrically connected on the lower conductive portion and adjoined with the cap layer. The lower conductive portion and the upper conductive portion have an interface therebetween. The interface is below an upper surface of the cap layer.

According to another embodiment, a method for forming a semiconductor structure is disclosed. The method comprises the following steps. An etching step is performed to remove a first material layer on a substrate outside a gate electrode to form a first opening, wherein a cap layer on the gate electrode is functioned as an etching stop layer for the etching step. A lower conductive portion is formed in the first opening. A second material layer is formed on the lower conductive portion. Another etching step is performed to remove the second material layer to form a second opening exposing the lower conductive portion, wherein the cap layer is functioned as an etching stop layer for the another etching step. An upper conductive portion is formed in the second opening.

Figure 1A:
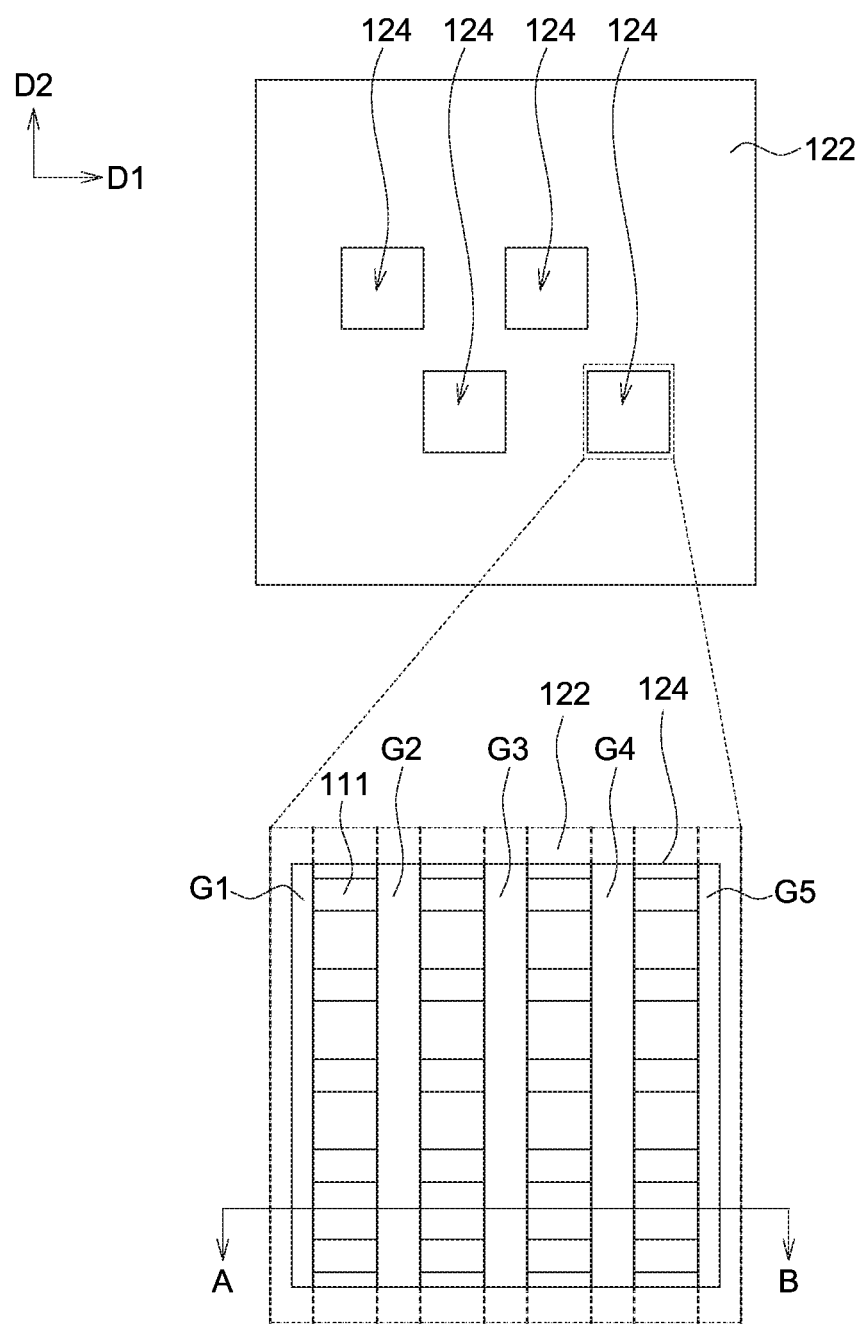
FIG. 1A to FIG. 12D illustrate a method for forming a semiconductor structure according to a concept of a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are provided hereinafter with reference to the accompanying drawings for describing the related procedures and configurations. It is noted that not all embodiments of the invention are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. The identical and/or similar elements of the embodiments are designated with the same and/or similar reference numerals.

FIG. 1A to FIG. 12D illustrate a method for forming a semiconductor structure according to a concept of a first embodiment.

Figure 1B:
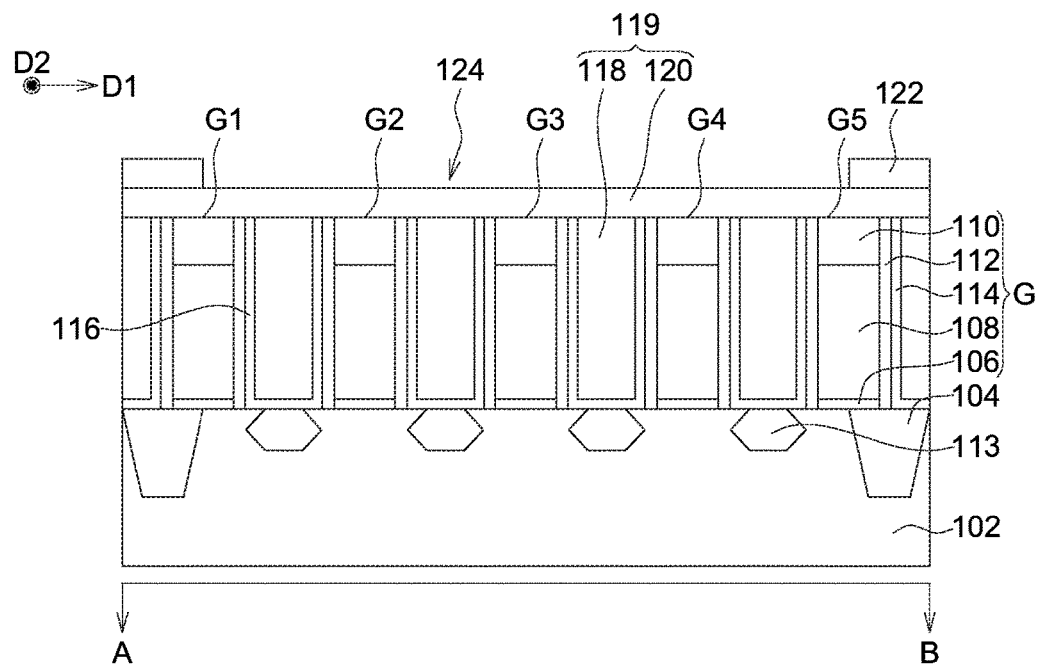

FIG. 1A illustrates a top view of the semiconductor structure. FIG. 1B illustrates a cross-section view of the semiconductor structure along a AB line in FIG. 1A.

Figure 16:
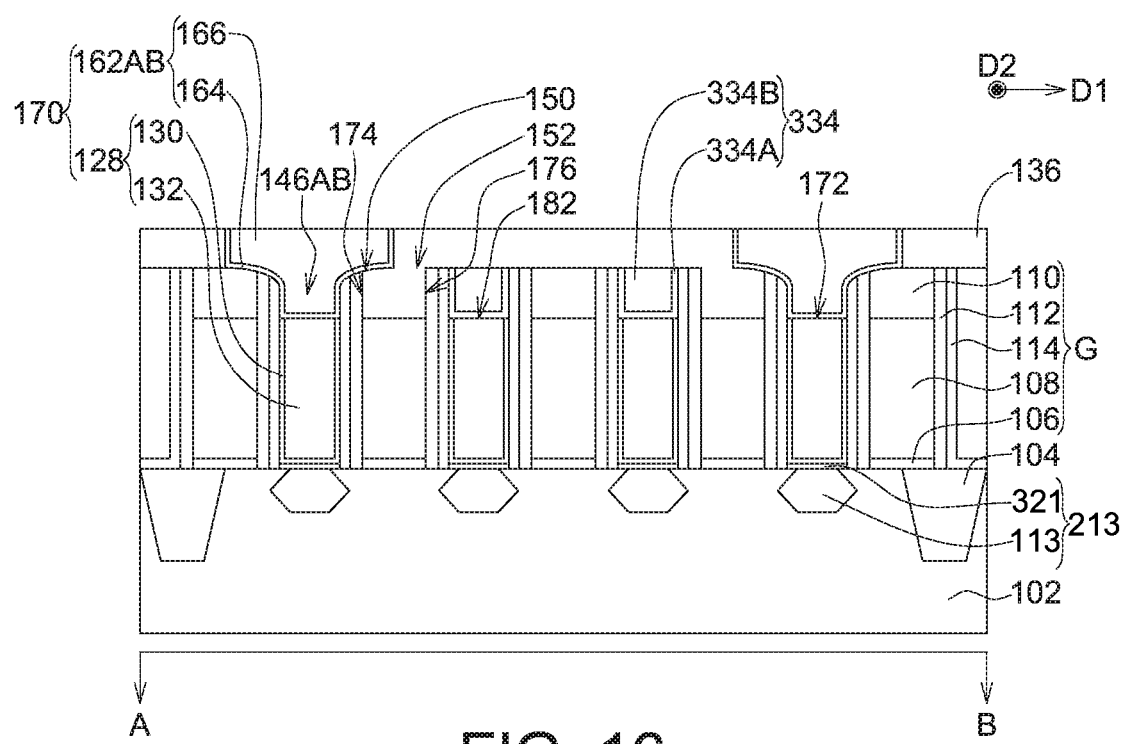
FIG. 16 illustrates a cross-section view a semiconductor structure according to a concept of a fifth embodiment.

Referring to FIG. 1B, a substrate 102 is provided. The substrate 102 may comprise a silicon substrate, a silicon on insulator (SOI), or other suitable semiconductor substrates. An isolation element 104 may be formed in the substrate 102. The isolation element 104 may be used to define an active region. The isolation element 104 may comprise a shallow trench isolation, a deep trench isolation, a field oxide structure, or other suitable isolation designs. A gate dielectric layer 106 is on the substrate 102. The gate dielectric layer 106 may have a linear shape (as shown in FIG. 16), or have a U shape. A gate electrode 108 may be formed on the gate dielectric layer 106. The gate electrode 108 may comprise metal or other suitable conductive materials. A cap layer 110 may be formed on the gate electrode 108. The cap layer 110 may comprise a nitride, such as silicon nitride, etc., but is not limited thereto. A spacer 112 may be formed on sidewalls of the gate dielectric layer 106, the gate electrode 108 and the cap layer 110. The spacer 112 may comprise a nitride, such as silicon nitride, etc., but is not limited thereto. A source/drain electrode 113 may be formed in the substrate 102 outside the gate electrode 108. The source/drain electrode 113 may be formed with a doping method. In an embodiment, the source/drain electrode 113 may further comprise a metal silicide layer. A material film 116 may be formed on a sidewall of the spacer 112 and on the substrate 102. The material film 116 may comprise a nitride, such as silicon nitride, etc., but is not limited thereto. Gate structures G, such as gate structures G1-G5 arranged along a first direction D1 and separated from each other, each may comprise the gate dielectric layer 106, the gate electrode 108, the cap layer 110, the spacer 112, and a spacer 114. The spacer 114 may be a portion of the material film 116 on the sidewall of the spacer 112. A first material layer 119 may be formed on the gate structure G. The first material layer 119 may comprise a first material portion 118 and a second material portion 120. The first material portion 118 is formed between sidewalls of the gate structures G1-G5. The second material portion 120 is formed on upper surfaces of the gate structures G1-G5. In an embodiment, for example, the first material portion 118 comprises an inter-layer dielectric layer, comprising a material comprising an oxide, such as silicon oxide, etc. The second material portion 120 may comprise an oxide, such as silicon oxide, etc. A hard mask 122 is formed on the second material portion 120. The hard mask 122 may comprise a nitride, such as titanium nitride (TiN), silicon nitride (SiN), or other suitable materials, but is not limited thereto. The hard mask 122 may be patterned to form a hole 124.

Referring to FIG. 1A, for the sake of simplicity, it shows only the hard mask 122, the gate structures G (comprising the gate structures G1-G5) and a fin element 111 of the semiconductor structure. The hard mask 122 comprises a plurality of the holes 124. FIG. 1A also shows an enlarged view of a portion of the semiconductor structure corresponding to one of the holes 124, which shows, the gate structures G1-G5 extending in the first direction D1 are formed on the fin elements 111 extending in a second direction D2. In an embodiment, a transistor may comprise the gate structure G, the source/drain electrode 113 and the fin element 111.

Figure 2:
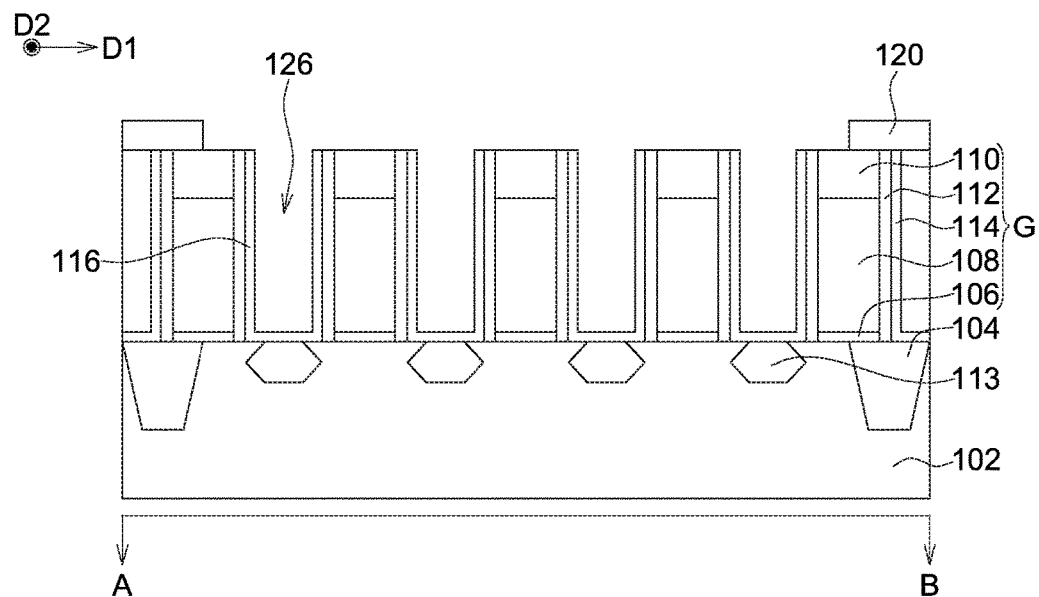

Referring to FIG. 2, an etching step may be performed to remove the second material portion 120 and the first material portion 118 of the first material layer 119 exposed by the hole 124 of the hard mask 122 so as to form a first opening 126. In embodiments, the cap layer 110 of the gate structure G functions as an etching stop layer for the etching step for forming the first opening 126. Then the hard mask 122 may be removed by an etching method or a CMP method. In an embodiment, the hard mask 122 may be removed by the etching step for removing the first material layer 119. In another embodiment, the hard mask 122 may be removed by an additional individual step.

Figure 3:
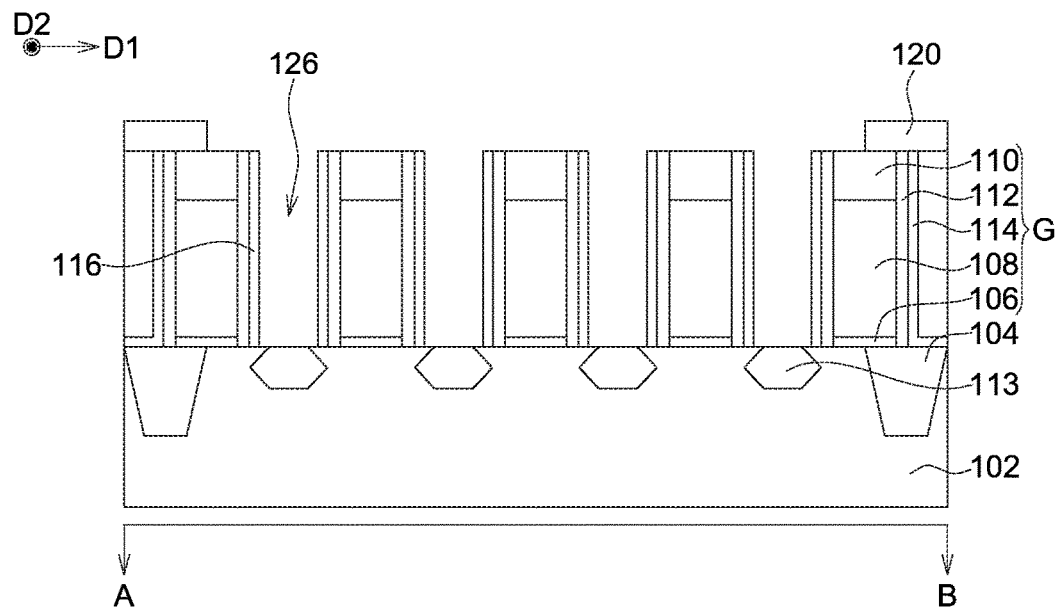

Referring to FIG. 3, an etching step may be performed to remove a portion of the material film 116 on the substrate 102 so that the first opening 126 exposes the substrate 102 (or the source/drain electrode 113).

Figure 4:
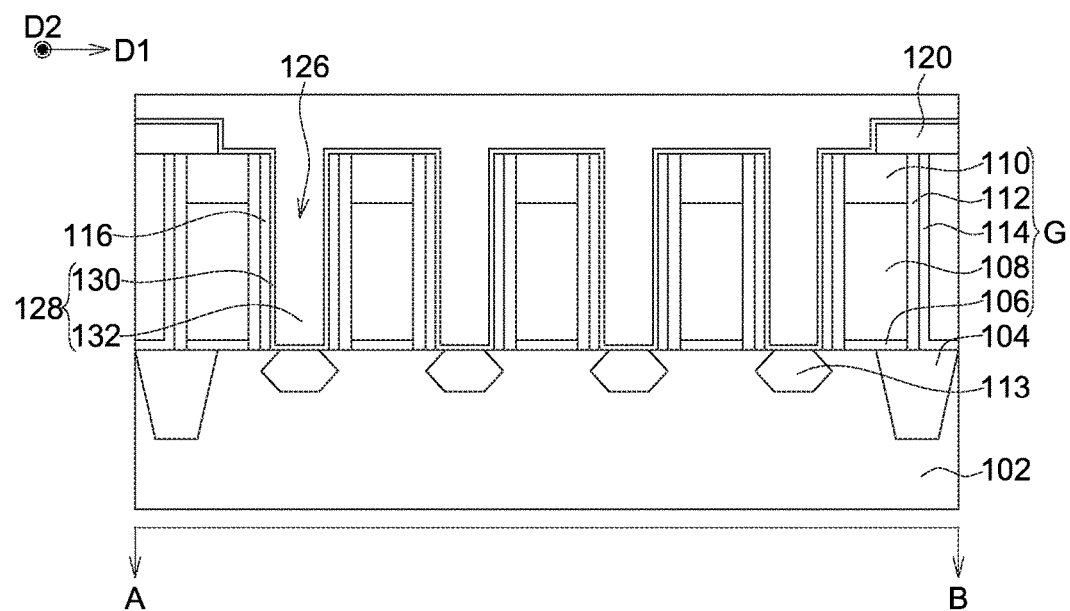

Referring to FIG. 4, a lower conductive portion 128 may be formed in the first opening 126. For example, the lower conductive portion 128 may comprise a conductive film 130 and a conductive material 132. The conductive film 130 is formed on an upper surface of the substrate 102 (or the source/drain electrode 113) and a sidewall of the spacer 114 exposed by the first opening 126, and may be formed on an upper surface of the gate structure G and the second material portion 120. The conductive material 132 may be formed on the conductive film 130, and to fill the first opening 126. In an embodiment, the conductive film 130 and the conductive material 132 may use different materials respectively. For example, the conductive film 130 may be a diffusion barrier layer, and a material of which may comprise TaN, TiN, MoN, etc., but is not limited thereto. For example, the conductive material 132 may comprise tungsten, cobalt, etc. However, the present disclosure is not limited thereto. The conductive film 130 and the conductive material 132 may use other suitable conductive materials.

Figure 5:
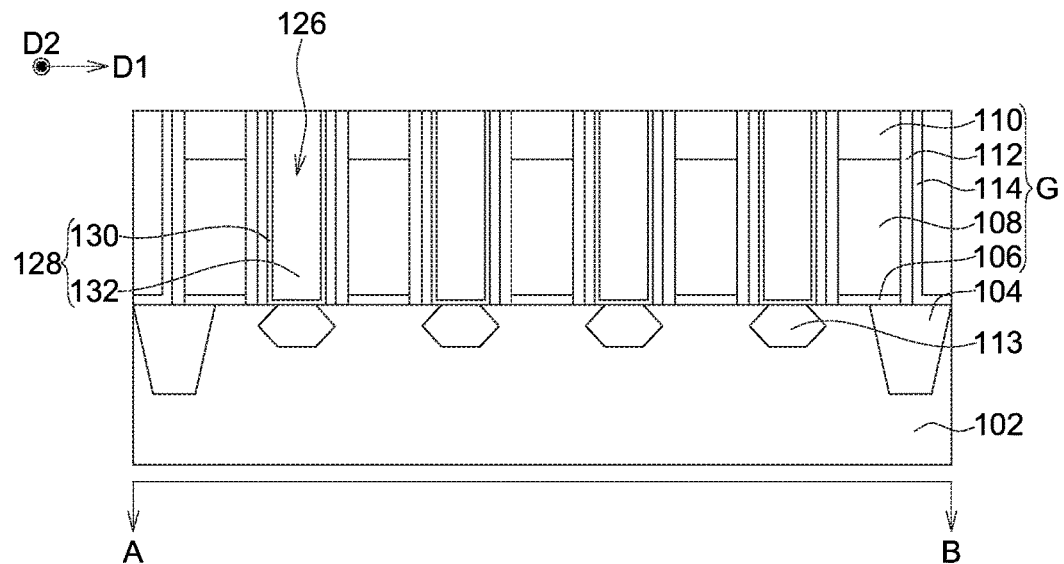

Referring to FIG. 5, a planarization step may be performed with a chemical mechanical polishing method to obtain a flat surface aligning with at least an upper surface of the cap layer 110.

Figure 6:
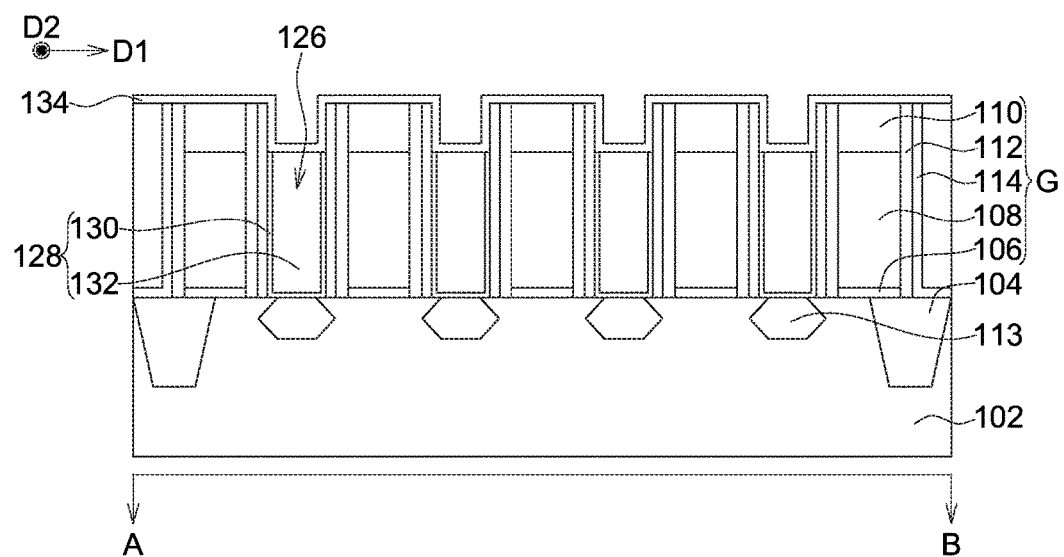
Figure 7:
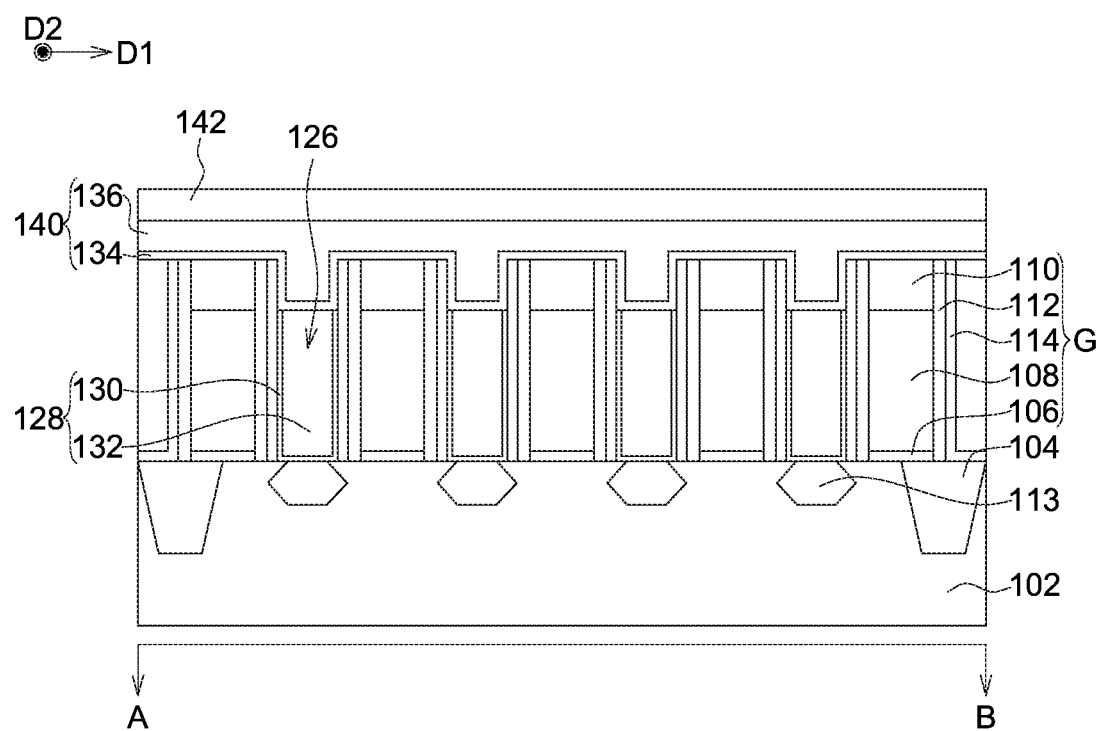

Referring to FIG. 6, the lower conductive portion 128 in the first opening 126 may be etched back. An insulating layer 134 may be formed in the first opening 126, and extended on the upper surface of the gate structure G. In an embodiment, insulating layer 134 may be a conformal film formed by a deposition method. The insulating layer 134 comprises silicon carbon nitride (SiCN), silicon carbide (SiC), etc., but is not limited thereto Referring to FIG. 7, a dielectric layer 136 may be formed on the insulating layer 134. The dielectric layer 136 may be formed by using a deposition method. The dielectric layer 136 comprises an oxide, such as silicon oxide, etc., but is not limited thereto. A chemical mechanical polishing may be performed to the dielectric layer 136 to flatten an upper surface of the dielectric layer 136. In an embodiment, a second material layer 140 may comprise the insulating layer 134 and the dielectric layer 136. A hard mask 142 may be formed on the dielectric layer 136. In an embodiment, the hard mask 142 comprises titanium nitride (TiN), etc., but is not limited thereto.

Figure 8A:
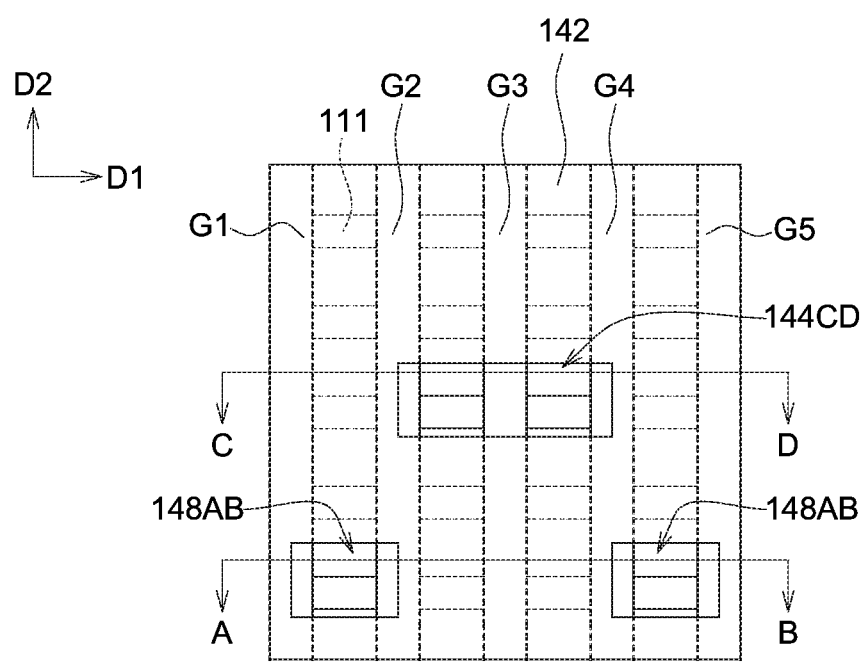
Figure 8B:
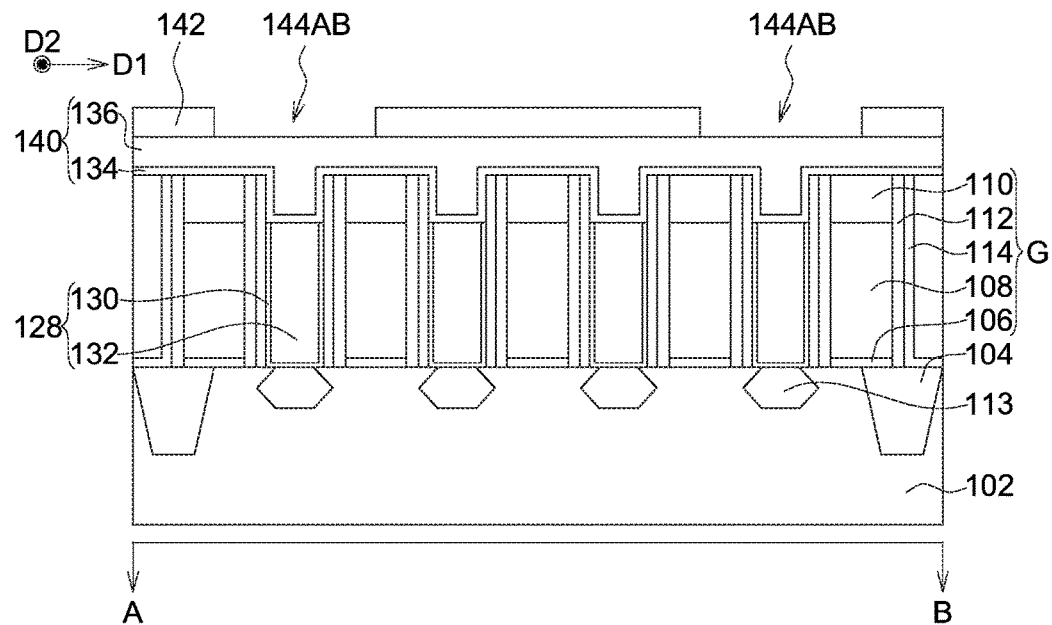
Figure 8C:
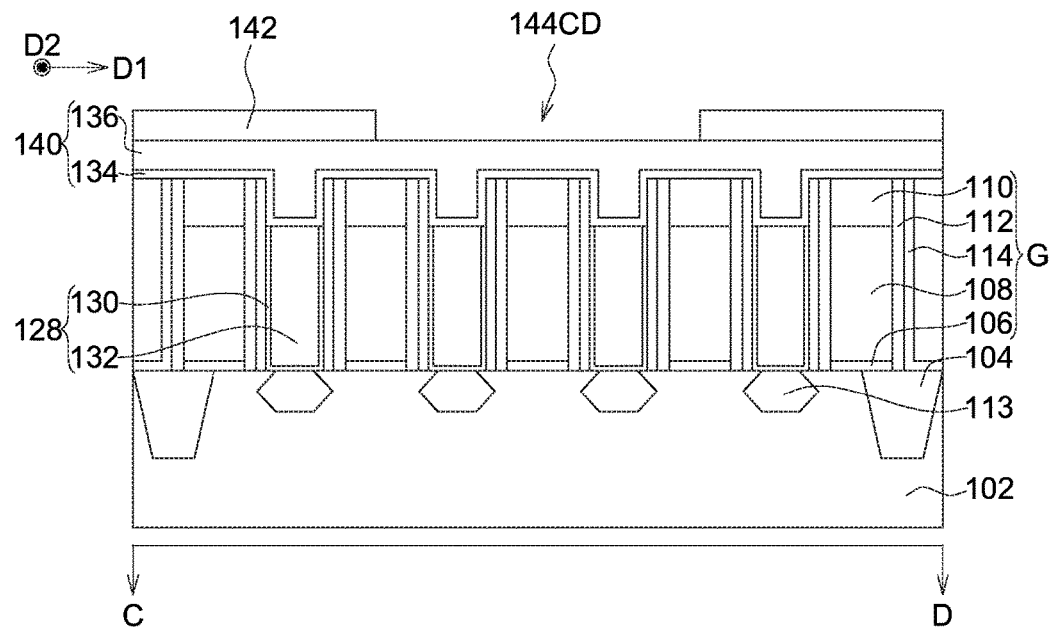

FIG. 8A illustrates a top view of the semiconductor structure. FIG. 8B illustrates a cross-section view of the semiconductor structure along the AB line in FIG. 8A. FIG. 8C illustrates a cross-section view of the semiconductor structure along the CD line in FIG. 8A. For the sake of simplicity, FIG. 8A shows only the hard mask 142, the gate structures G (comprising the gate structures G1-G5) and the fin element 111 of the semiconductor structure. Referring to FIG. 8A and FIG. 8B, the hard mask 142 may be patterned to form a hole 144AB. Referring to FIG. 8A and FIG. 8C, the hard mask 142 may be patterned to form a hole 144CD. In an embodiment, the hole 144AB and the hole 144CD may be formed by the same process. Then the hard mask 142 may be removed.

Figure 9A:
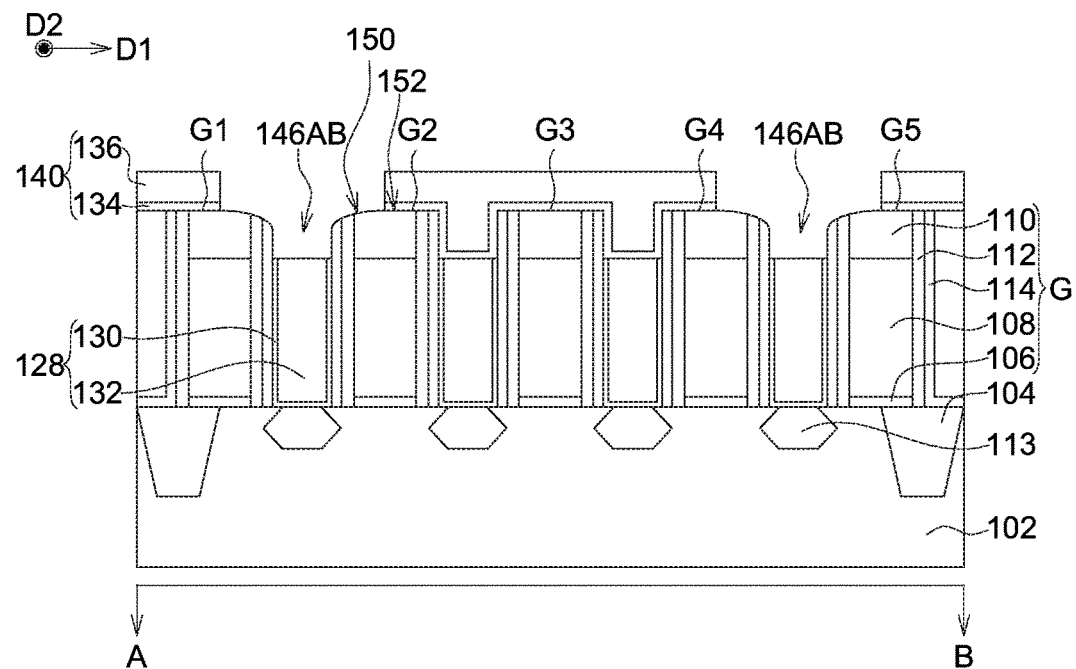
Figure 9B:
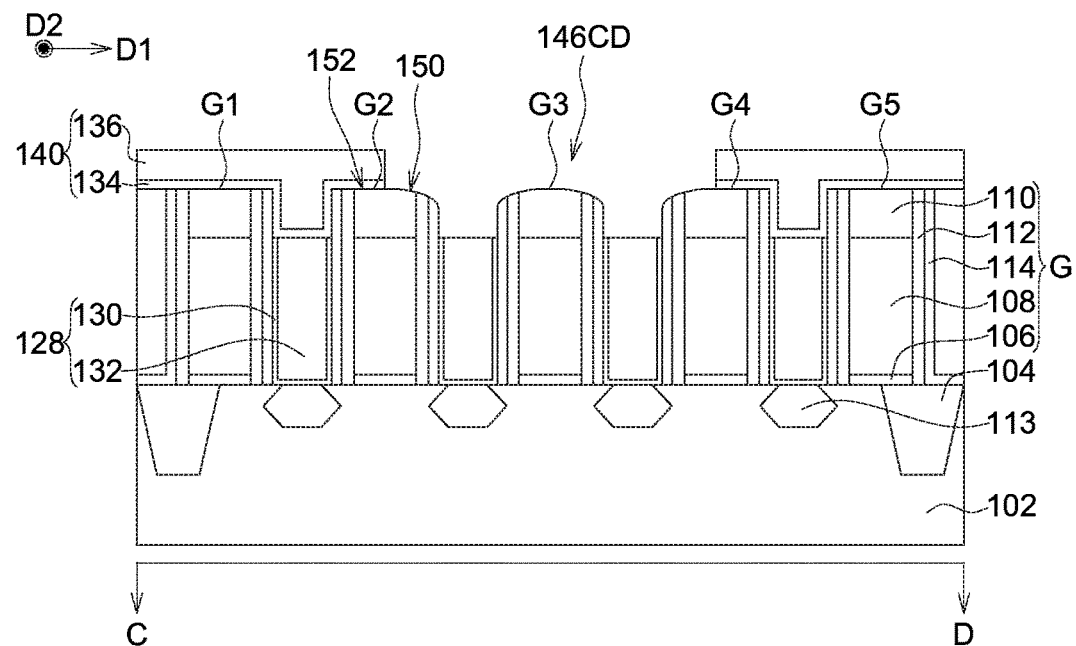

Referring to FIG. 9A and FIG. 9B, an etching step may be performed to remove the second material layer 140 exposed by the hole 144AB and the hole 144CD so as to form a second opening 146AB and a second opening 146CD exposing the lower conductive portion 128. In an embodiment, during the etching step for forming the second opening 146AB and the second opening 146CD, the gate structure G functions as a self-aligned gate with the cap layer 110 functioning as an etching stop layer. For example, the second opening 146AB in FIG. 9A is formed with using the gate structures G1, G2, G4, G5 as the etching stop layer. For example, the second opening 146CD in FIG. 9B is formed with using the gate structures G2, G3, G4 as the etching stop layer. Referring to FIG. 9A and FIG. 9B, in an embodiment, a height of the cap layer 110 exposed by the hole 144AB/hole 144CD may be reduced due to being consumed during the etch process. For example, an upper surface of the cap layer 110 of the gate structure G2 comprises a first upper surface 150 and a second upper surface 152. The first upper surface 150 is resulted from consuming the cap layer 110 exposed by the hole 144AB/144CD by the etching step. The second upper surface 152 is the upper surface of the cap layer 110 covered by the hole 144AB/144CD and not etched by the etching step. The first upper surface 150 is below the second upper surface 152. Situations for other gate structure elements may have arrangements in a similar fashion.

Figure 10A:
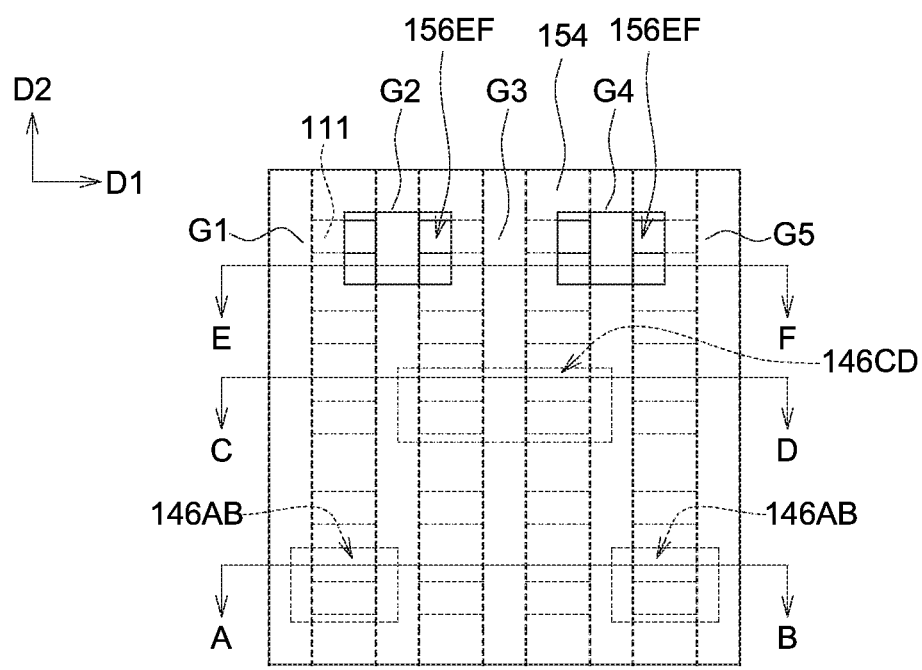
Figure 10B:
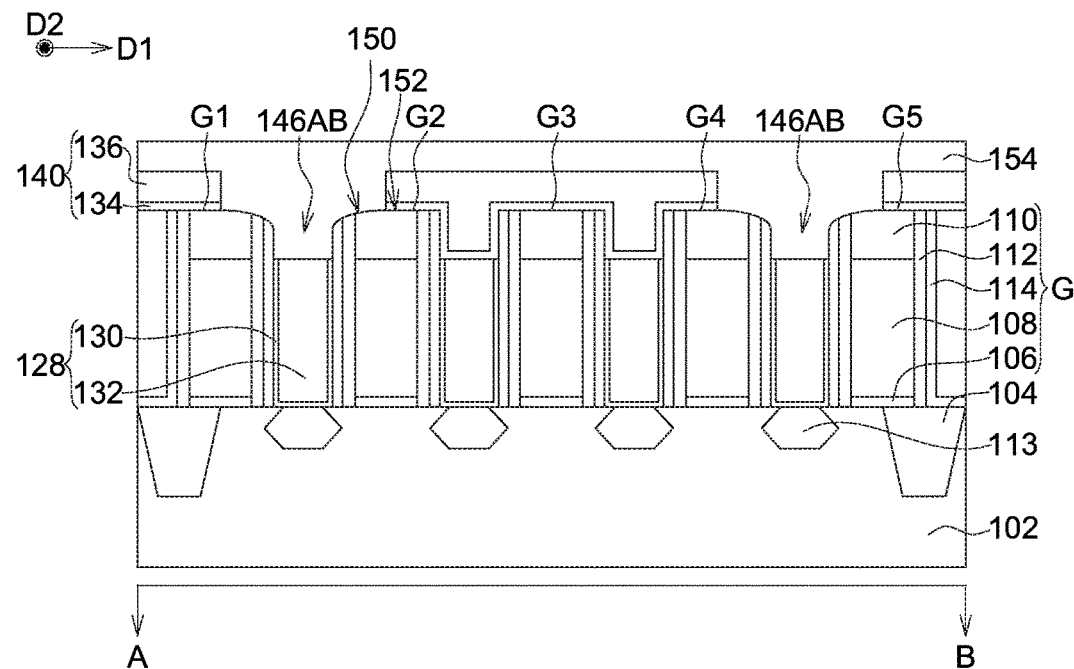
Figure 10C:
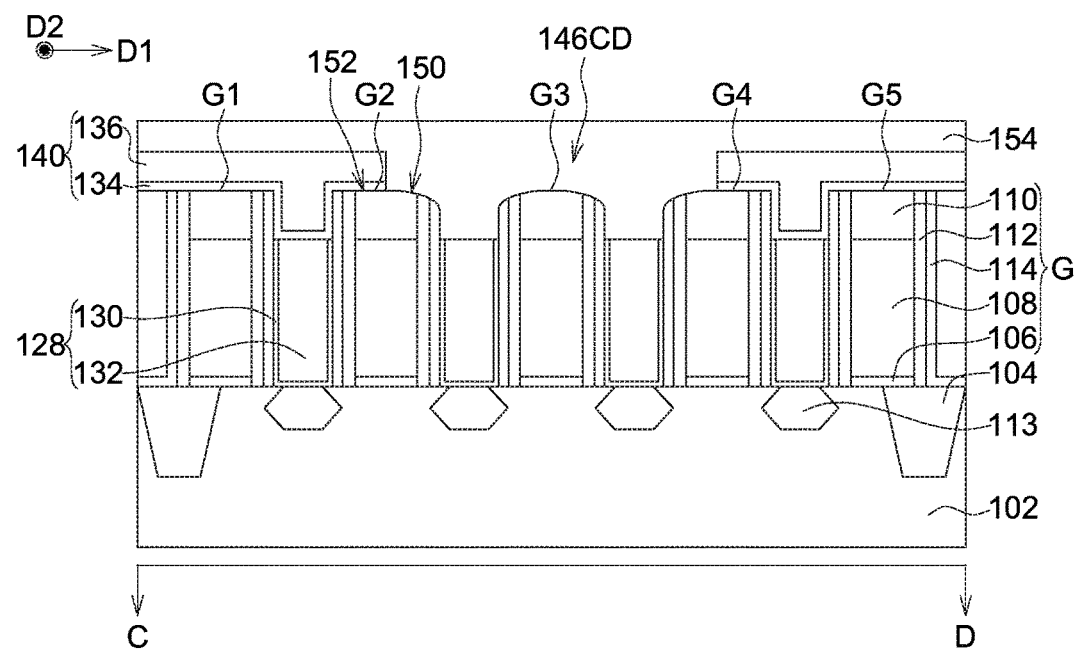
Figure 10D:
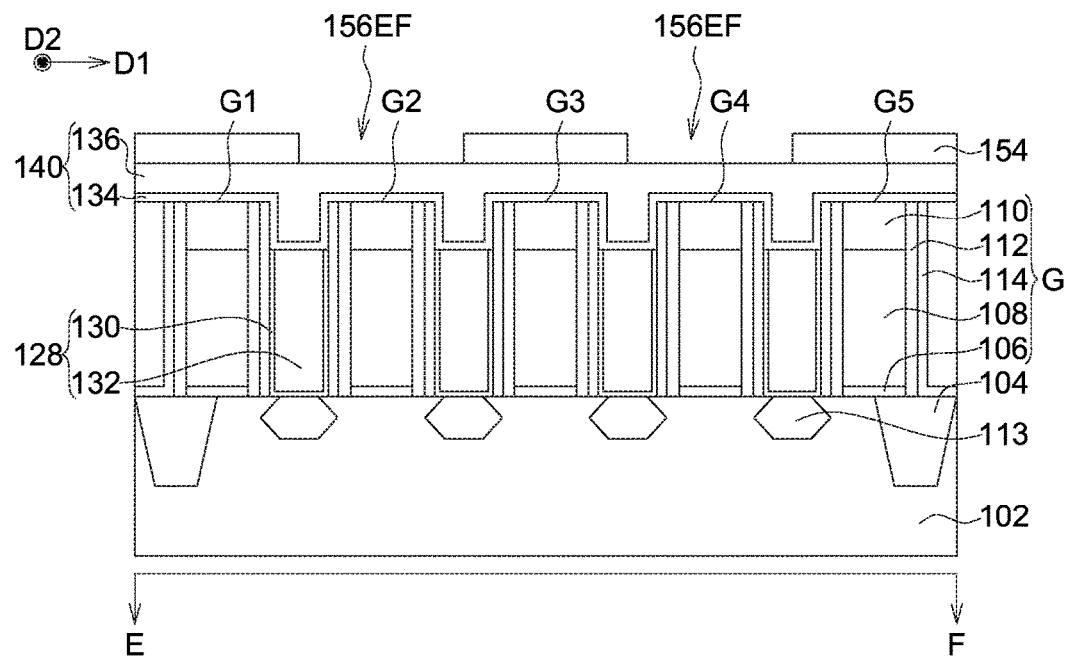

FIG. 10A to FIG. 10D are referred. FIG. 10A illustrates a top view of the semiconductor structure. FIG. 10B illustrates a cross-section view of the semiconductor structure along the AB line in FIG. 10A. FIG. 1C illustrates a cross-section view of the semiconductor structure along the CD line in FIG. 10A. FIG. 10D illustrates a cross-section view of the semiconductor structure along a EF line in FIG. 10A. A photoresist layer 154 may be formed to cover the entire semiconductor structure, and the photoresist layer 154 may be patterned to form a cavity 156EF. In an embodiment, the photoresist layer 154 may also comprise an antireflective layer. For the sake of simplicity, FIG. 10A shows only the photoresist layer 154, the gate structures G (comprising the gate structures G1-G5) and the fin element 111 of the semiconductor structure.

Figure 11:
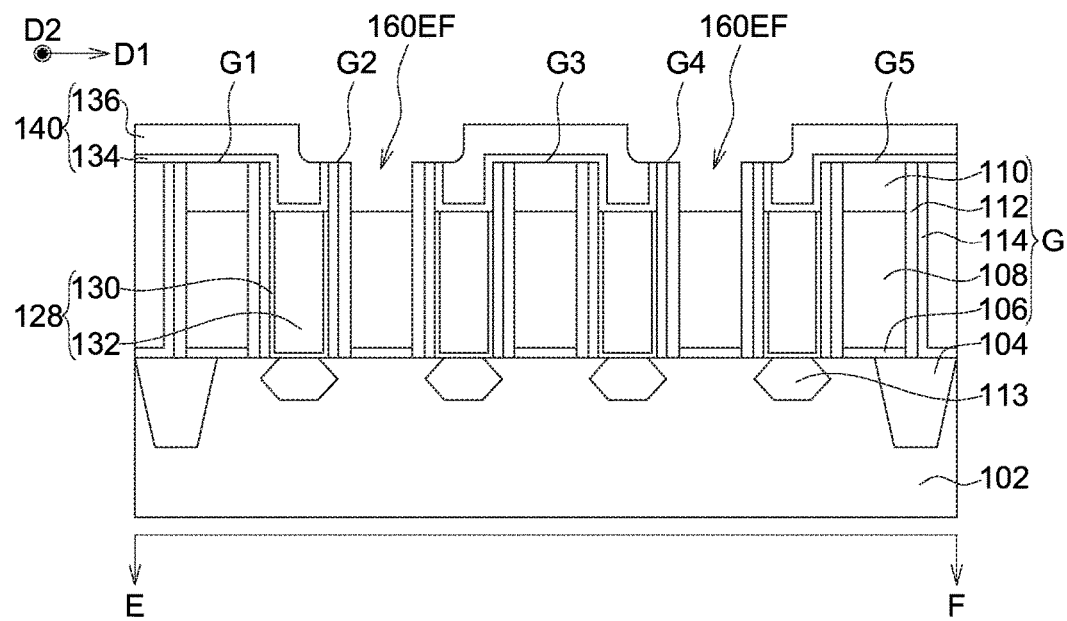

FIG. 11 is referred, which illustrates a cross-section view of the semiconductor structure along the EF line. An etching step is performed to remove the second material layer 140 and the cap layers 110 of the gate structures G2 and G4 exposed by the cavity 156EF of the photoresist layer 154 so as to form a hole 160EF exposing the gate electrode 108. Then the photoresist layer 154 may be removed.

Figure 12A:
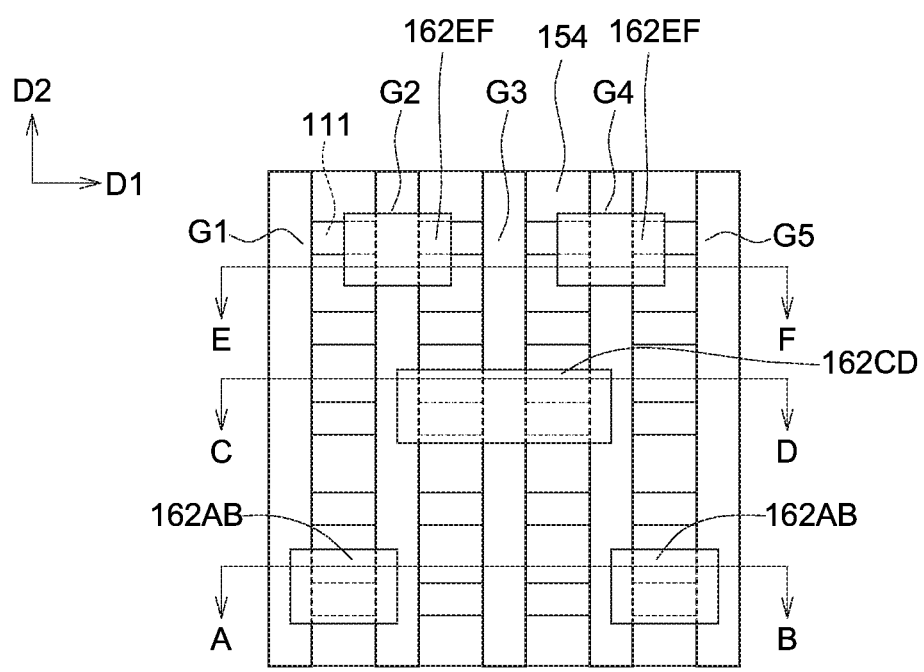
Figure 12B:
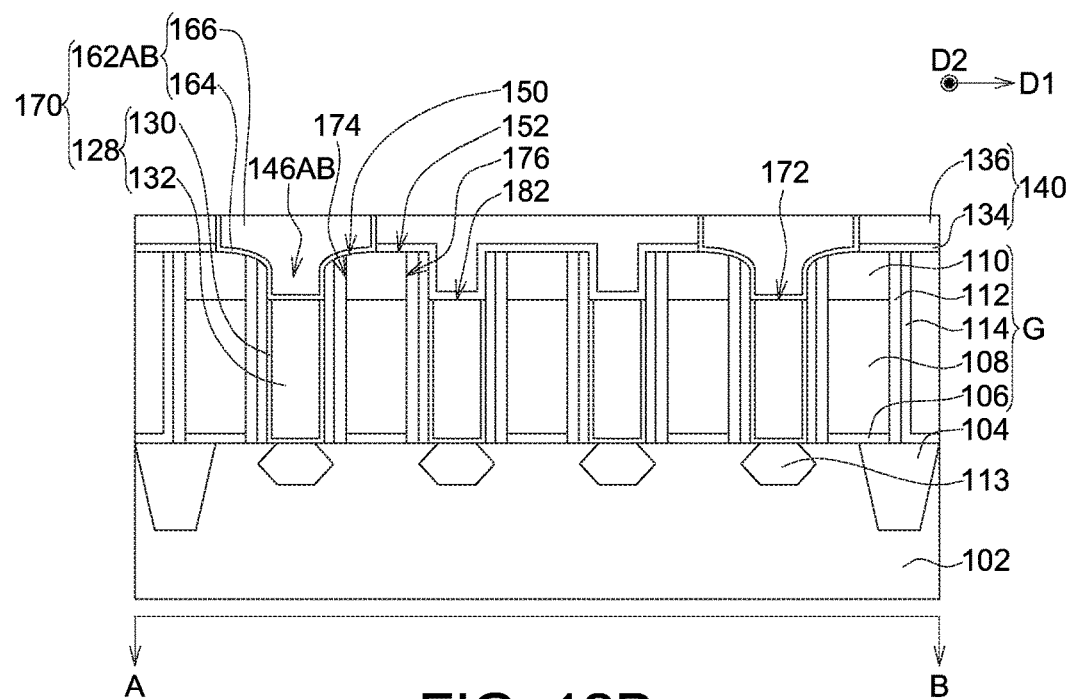
Figure 12C:
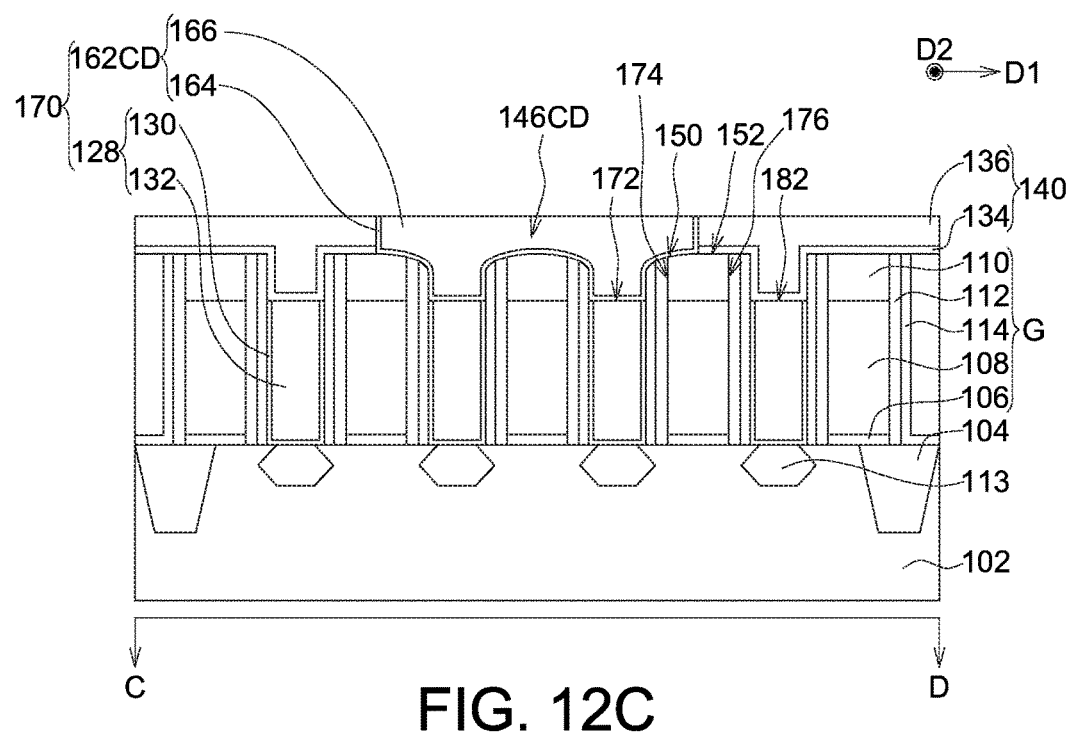
Figure 12D:
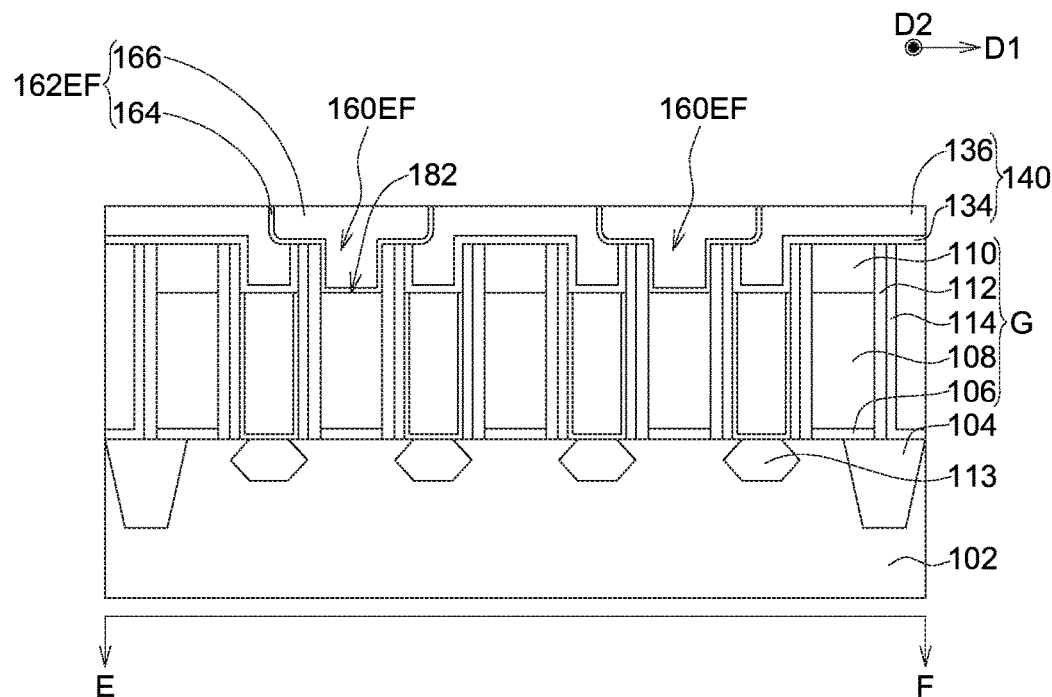

FIG. 12A illustrates a top view of the semiconductor structure. FIG. 12B illustrates a cross-section view of the semiconductor structure along the AB line in FIG. 12A. FIG. 12C illustrates a cross-section view of the semiconductor structure along the CD line in FIG. 12A. FIG. 12D illustrates a cross-section view of the semiconductor structure along the EF line in FIG. 12A. Referring to FIG. 12A and FIG. 12B, an upper conductive portion 162AB may be formed in the second opening 146AB. Referring to FIG. 12A and FIG. 12C, an upper conductive portion 162CD may be formed in the second opening 146CD. Referring to FIG. 12A and FIG. 12D, an upper conductive portion 162EF may be formed in the hole 160EF. Referring to FIG. 12B to FIG. 12C, the upper conductive portion 162AB/the upper conductive portion 162CD may comprise a conductive film 164 formed on a bottom and a sidewall of the second opening 146AB/the second opening 146CD, and a conductive material 166 filling the second opening 146AB/the second opening 146CD. Referring to FIG. 12D, the upper conductive portion 162EF may comprise the conductive film 164 formed on a bottom and a sidewall of the hole 160EF, and the conductive material 166 filling the hole 160EF. The upper conductive portion 162EF may be electrically connected to the gate electrode 108.

Referring to FIG. 12B to FIG. 12C, in an embodiment, the upper conductive portion 162AB, the upper conductive portion 162CD and the upper conductive portion 162EF may be formed simultaneously by the same process. In an embodiment, the conductive film 164 and the conductive material 166 may use different materials respectively. For example, the conductive film 164 may be a diffusion barrier layer, and a material of which may comprise TaN, TiN, MoN, etc., but is not limited thereto. For example, the conductive material 166 may comprise tungsten, cobalt, etc. However, the present disclosure is not limited thereto. The conductive film 164 and the conductive material 166 may use other suitable conductive materials. In an embodiment, a planarization process may be performed to the upper conductive portion 162AB, the upper conductive portion 162CD and the upper conductive portion 162EF by a chemical mechanical polishing method.

A conductive element 170 shown in FIG. 12B comprises the upper conductive portion 162AB and the lower conductive portion 128 electrically connected to each other. The conductive element 170 shown in FIG. 12C comprises the upper conductive portion 162CD and the lower conductive portion 128 electrically connected to each other. In FIG. 12B and FIG. 12C, the conductive element 170 may be electrically connected to the source/drain electrode 113. The upper conductive portion 162AB/162CD of the conductive element 170 may be adjoined with the outer surface and the upper surface of the spacer 114, the upper surface of the spacer 112, and the first upper surface 150 of the cap layer 110 of the gate structure G. The conductive element 170 may be not adjoined with the second upper surface 152 of the cap layer 110. The upper conductive portion 162AB/162CD may have a lateral size (such as a size of a portion above the cap layer 110 in the first direction D1) larger than a lateral size of the lower conductive portion 128. The lower conductive portion 128 and the upper conductive portion 162AB/162CD have an interface 172 therebetween. The interface 172 comprises an interface between the conductive film 164 of the upper conductive portion 162AB/162CD and the conductive film 130 of the lower conductive portion 128, and an interface between the conductive film 164 of the upper conductive portion 162AB/162CD and the conductive material 132 of the lower conductive portion 128. The interface 172 is below the upper surface of the cap layer 110 (comprising the first upper surface 150 and the second upper surface 152). The interface 172 is a lateral coplanar surface between the lower conductive portion 128 and the upper conductive portion 162AB/162CD, such as a xy-plane defined with the first direction D1 as an x-axis and the second direction D2 as a y-axis. Referring to FIG. 12B, for example, the cap layer 110 of the gate structure G2 have a first side surface 174 and a second side surface 176 opposing to the first side surface 174. The upper conductive portion 162AB is on the first side surface 174, while the insulating layer 134 is on the second side surface 176. The insulating layer 134 and the lower conductive portion 128 have an interface 182 therebetween. The interface 182 is below the upper surface of the cap layer 110 (comprising the first upper surface 150 and the second upper surface 152). Situations for relationships between the other gate structures and the other elements may be in a similar fashion.

Referring to FIG. 12A to FIG. 12D, in embodiments, upper conductive portions 162AB and 162CD electrically connected to the source/drain electrode 113, and the upper conductive portion 162EF electrically connected to the gate structure G are all formed in the active region. Therefore, the semiconductor structure according to the concept of embodiments can have a higher device density. For example, in a conventional semiconductor structure, an upper conductive portion electrically connected to the gate structure G is disposed outside the active region, and therefore occupies an additional area outside the active region, which results in difficulty in increasing the device density. Therefore, the semiconductor structure according to the concept of embodiments can have a higher device density than the conventional semiconductor structure. In addition, the upper conductive portion 162AB and the upper conductive portion 162CD may be formed with using the cap layer 110 of the gate structure G as the hard mask, and therefore the height positions of upper conductive portion 162AB and the upper conductive portion 162CD can be as close to the lower conductive portion 128 as possible to provide a lower resistance for the substrate 102 (or the source/drain electrode 113), which can improve operating efficiency for the device.

Concepts of the present disclosure may be varied properly. For example, in an embodiment, after the etching step illustrated with FIG. 3, a metal silicidation step may be performed to the source/drain electrode 113 exposed by the first opening 126. In an embodiment, the hard mask 122 (FIG. 1A, FIG. 1B) may be removed by the chemical mechanical polishing step illustrated with FIG. 5.

Figure 13:
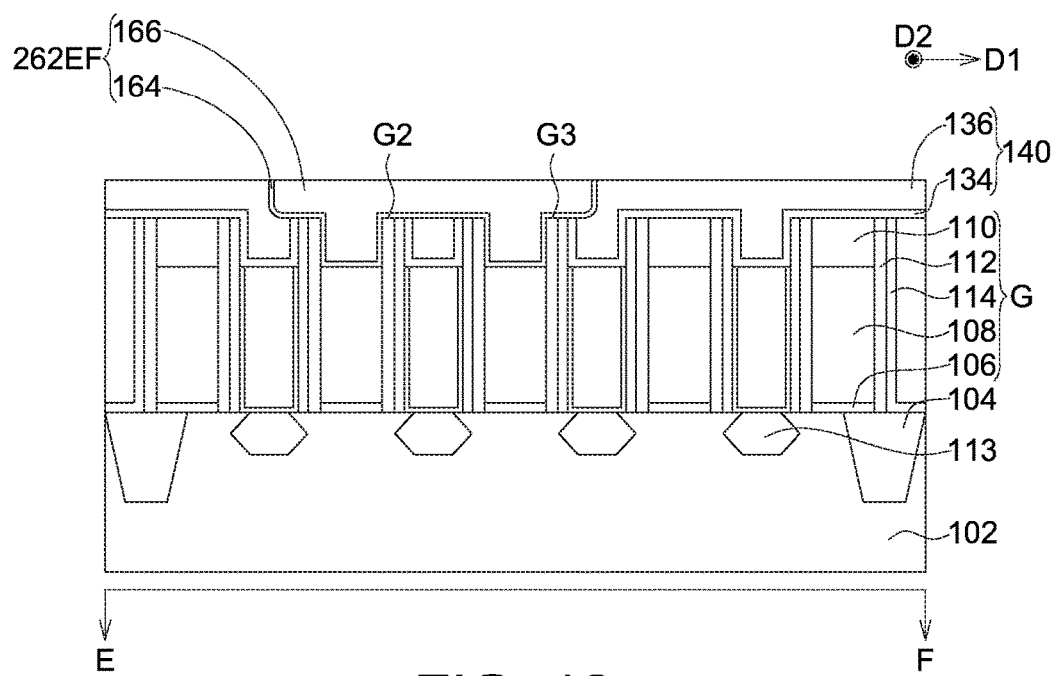
FIG. 13 illustrates a cross-section view a semiconductor structure according to a concept of a second embodiment.

FIG. 13 illustrates a cross-section view a semiconductor structure according to a concept of a second embodiment. FIG. 13 is different from FIG. 12D in that an upper conductive portion 262EF is electrically connected to the gate electrodes 108 of the gate structure G2 and the gate structure G3 simultaneously.

Figure 14A:
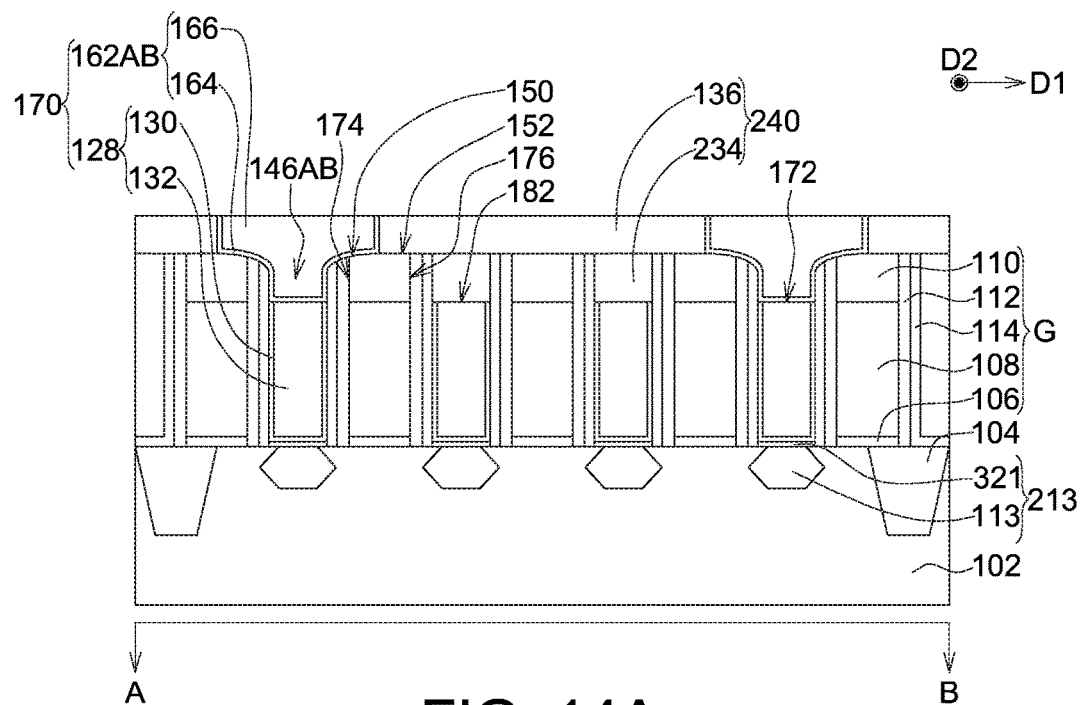
FIG. 14A to FIG. 14C illustrate a semiconductor structure and a method for forming the semiconductor according to a concept of a third embodiment.
Figure 14B:
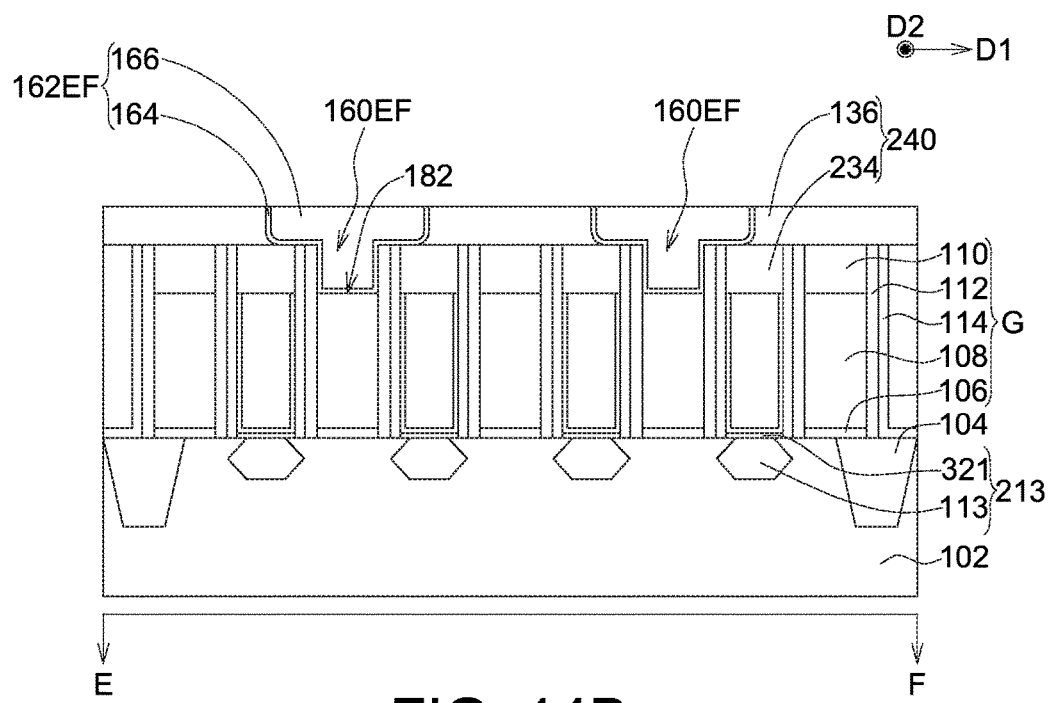
Figure 14C:
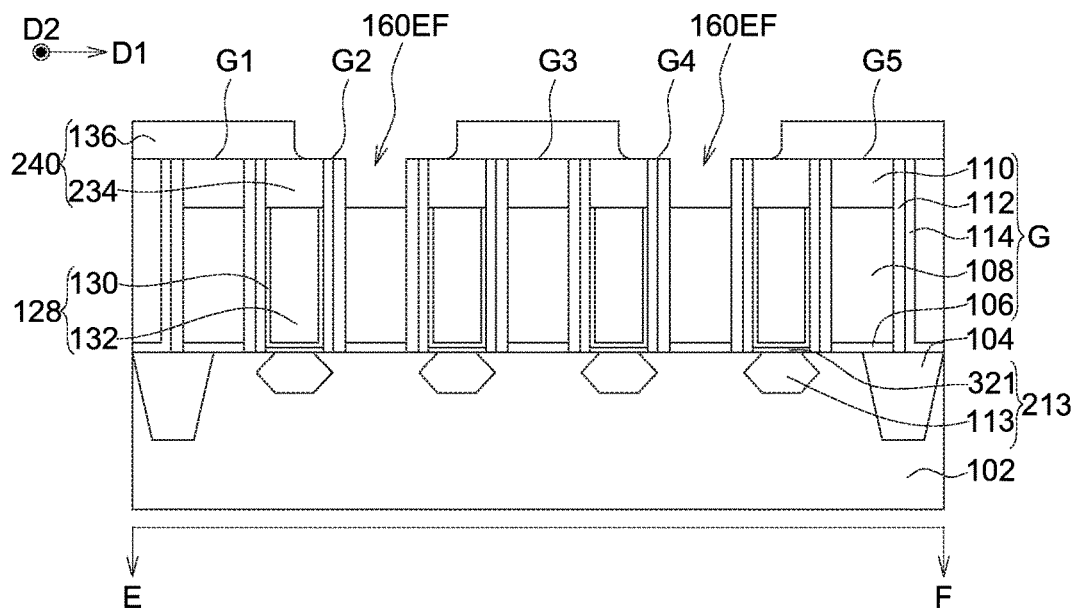

FIG. 14A to FIG. 14C are used to illustrate a semiconductor structure and a method for forming the semiconductor according to a concept of a third embodiment. Differences from FIG. 14A to FIG. 12B, and from FIG. 14B to FIG. 12D are illustrated as the following. The insulating layer 134 is replaced by an insulating layer 234. A second material layer 240 may comprise the insulating layer 234 and the dielectric layer 136. An upper surface of the insulating layer 234 may be aligned with upper surfaces of the spacer 112 and the spacer 114 of the gate structure G. The insulating layer 234 comprises silicon carbon nitride (SiCN), silicon carbide (SiC), etc., but is not limited thereto. A source/drain electrode 213 may comprise the source/drain electrode 113 formed by doping the substrate 102, and a metal silicide layer 321 formed on the source/drain electrode 113. The metal silicide layer 321 may comprise titanium silicide (TiSi), nickel silicide (NiSi), cobalt silicide (CoSi), etc., but is not limited thereto. For example, in this embodiment, the semiconductor structure may be manufactured by a method replacing the step illustrated in FIG. 6 by filling the insulating layer 234 in the first opening 126, and performing a chemical mechanical polishing to flatten an upper surface, and then performing the subsequent manufacturing steps with the similar concepts. Situations for the other structure portions of the semiconductor structure may be in a similar fashion. In an embodiment, for example, the step illustrated in FIG. 11 may be replaced by the cross-section view in FIG. 14C, wherein the insulating layer 234 may function as a hard mask for the etching step for forming the hole 160EF. The insulating layer 234 aligning with the gate structure G can provide an excellent etching mask effect. It can avoid an undesired short of the subsequently formed upper conductive portion 162EF (FIG. 14B) to the lower conductive portion 128 outside the gate structure G due to over etching.

Figure 15:
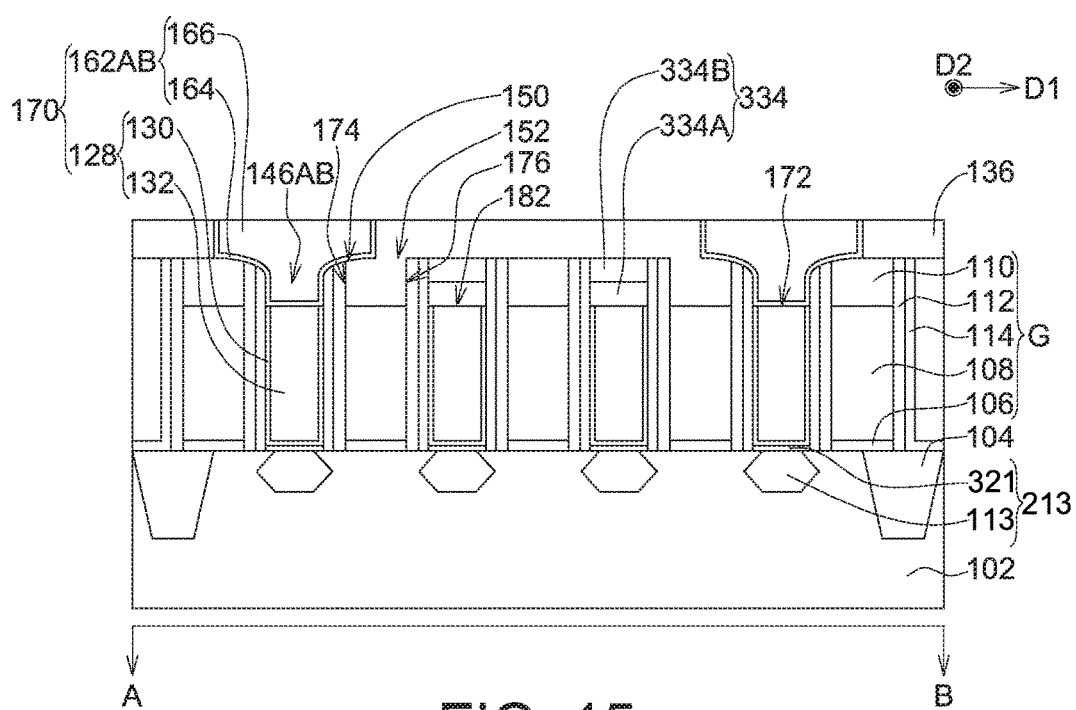
FIG. 15 illustrates a cross-section view a semiconductor structure according to a concept of a fourth embodiment.

FIG. 15 illustrates a cross-section view a semiconductor structure according to a concept of a fourth embodiment. Difference between FIG. 15 and FIG. 14 are illustrated as the following. An insulating layer 334 comprises a first insulating layer 334A and a second insulating layer 334B on a top surface of the first insulating layer 334A. The first insulating layer 334A and the second insulating layer 334B may use different materials. For example, the first insulating layer 334A comprises an oxide, such as silicon oxide, etc., but is not limited thereto. The second insulating layer 334B comprises silicon carbon nitride (SiCN), silicon carbide (SiC), etc., but is not limited thereto. For example, in this embodiment, the semiconductor structure may be formed by a method replacing the step illustrated in FIG. 6 by forming the first insulating layer 334A in the first opening 126, then performing an etching back step, forming the second insulating layer 334B to fill the first opening 126, and then performing a chemical mechanical polishing to flatten an upper surface, and then performing the subsequent steps with the similar concepts. Situations for the other structure portions of the semiconductor structure may be in a similar fashion. In an embodiment, the second insulating layer 334B may function as a hard mask for the etching step.

FIG. 16 illustrates a cross-section view a semiconductor structure according to a concept of a fifth embodiment. Differences between FIG. 16 and FIG. 15 are illustrated as the following. The insulating layer 334 comprises the first insulating layer 334A and the second insulating layer 334B. The first insulating layer 334A has a U shape, and the second insulating layer 334B is formed on the first insulating layer 334A. For example, in this embodiment, the semiconductor structure may be manufactured by a method replacing the step illustrated in FIG. 6 by forming the first insulating layer 334A conformal in the first opening 126 by a deposition method, forming the second insulating layer 334B to fill the first opening 126, performing a chemical mechanical polishing to flatten an upper surface, and then performing the subsequent steps with the similar concepts. Situations for the other structure portions of the semiconductor structure may be in a similar fashion.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a substrate;
    a gate structure on the substrate, the gate structure comprising a gate electrode and a cap layer on the gate electrode; and
    a conductive element adjoined with an outer surface of the gate structure, the conductive element comprising:
        a lower conductive portion; and
        an upper conductive portion electrically connected on the lower conductive portion and adjoined with the cap layer, wherein the lower conductive portion and the upper conductive portion have an interface therebetween, the interface is below an upper surface of the cap layer, wherein in a lateral direction, a size of the upper conductive portion is larger than a size of the lower conductive portion.

2. The semiconductor structure according to claim 1, wherein the lower conductive portion and the upper conductive portion have different conductive materials.

3. The semiconductor structure according to claim 1, wherein the interface between the lower conductive portion and the upper conductive portion is a lateral coplanar surface between the lower conductive portion and the upper conductive portion.

4. The semiconductor structure according to claim 1, wherein the upper conductive portion is adjoined with the upper surface of the cap layer.

5. The semiconductor structure according to claim 1, wherein the cap layer comprises a first upper surface and a second upper surface adjacent to the first upper surface, the first upper surface is below the second upper surface, wherein upper conductive portion is adjoined with the first upper surface, but not adjoined with the second upper surface.

6. The semiconductor structure according to claim 1, further comprising an insulating layer, wherein the cap layer has a first side surface and a second side surface respectively on different sides of the cap layer, the upper conductive portion is on the first side surface, the insulating layer is on the second side surface, the insulating layer is not disposed between the upper conductive portion and the cap layer.

7. The semiconductor structure according to claim 6, wherein the first side surface and the second side surface of the cap layer are opposing to each other.

8. The semiconductor structure according to claim 6, further comprising another lower conductive portion on another outer surface of the gate structure opposing to the outer surface of the gate structure, wherein the insulating layer is on the another lower conductive portion, an interface between the insulating layer and the another lower conductive portion is below the upper surface of the cap layer.

9. The semiconductor structure according to claim 1, wherein the semiconductor structure comprises a transistor comprising the gate structure and a source/drain electrode, wherein the conductive element is electrically connected to the source/drain electrode.

10. The semiconductor structure according to claim 1, wherein the gate structure further comprises a spacer on a side surface of the gate electrode.

11. A method for forming a semiconductor structure, comprising:
　　performing an etching step to remove a first material layer on a substrate outside a gate structure to form a first opening, wherein the gate structure comprises a gate electrode and a cap layer on the gate electrode, the cap layer on the gate electrode is functioned as an etching stop layer for the etching step;
　　forming a lower conductive portion in the first opening;
　　forming a second material layer on the lower conductive portion;
　　performing another etching step to remove the second material layer to form a second opening exposing the lower conductive portion, wherein the cap layer is functioned as an etching stop layer for the another etching step; and
　　forming an upper conductive portion in the second opening, wherein the upper conductive portion is electrically connected on the lower conductive portion and adjoined with the cap layer, the lower conductive portion and the upper conductive portion have an interface therebetween, the interface is below an upper surface of the cap layer, wherein in a lateral direction, a size of the upper conductive portion is larger than a size of the lower conductive portion.

12. The method for forming the semiconductor structure according to claim 11, further comprising performing an etching back process to the lower conductive portion in the first opening.

13. The method for forming the semiconductor structure according to claim 11, wherein the second material layer is formed by a method comprising forming an insulating layer in the first opening and on the lower conductive portion.

14. The method for forming the semiconductor structure according to claim 11, wherein the lower conductive portion is formed by a method comprising:
　　forming a conductive film on a bottom and a sidewall of the first opening; and
　　forming a conductive material to fill the first opening.

15. The method for forming the semiconductor structure according to claim 14, wherein the conductive film and the conductive material have different materials.

16. The method for forming the semiconductor structure according to claim 11, wherein the upper conductive portion is formed by a method comprising:
　　forming a conductive film on a bottom and a sidewall of the second opening; and
　　forming a conductive material to fill the second opening.

17. The method for forming the semiconductor structure according to claim 16, wherein the conductive film and the conductive material have different materials.

18. The method for forming the semiconductor structure according to claim 11, further comprising performing yet another etching step to remove the cap layer to form a hole exposing the gate electrode.

19. The method for forming the semiconductor structure according to claim 18, further comprising forming another upper conductive portion in the hole.

* * * * *